United States Patent
Kinder (10) Patent No.: US 7,727,335 B2
(45) Date of Patent: Jun. 1, 2010

(54) DEVICE AND METHOD FOR THE EVAPORATIVE DEPOSITION OF A COATING MATERIAL

(75) Inventor: Helmut Kinder, Freising (DE)

(73) Assignee: Theva Dunnschichttechnik GmbH, Ismaning (DE)

( * ) Notice: Subject to any disclaimer, the term of this patent is extended or adjusted under 35 U.S.C. 154(b) by 994 days.

(21) Appl. No.: 10/533,776

(22) PCT Filed: Oct. 15, 2003

(86) PCT No.: PCT/EP03/11428
§ 371 (c)(1),
(2), (4) Date: Oct. 13, 2005

(87) PCT Pub. No.: WO2004/041985
PCT Pub. Date: May 21, 2004

(65) Prior Publication Data
US 2006/0051495 A1    Mar. 9, 2006

(30) Foreign Application Priority Data
Nov. 5, 2002   (EP) .................................. 02024901

(51) Int. Cl.
*C23C 16/00* (2006.01)
(52) U.S. Cl. .......... 118/726; 118/723 EB; 118/723 VE; 118/715
(58) Field of Classification Search .................. 118/722, 118/723 EB, 726, 723 VE, 715
See application file for complete search history.

(56) References Cited

U.S. PATENT DOCUMENTS 3,654,109 A   4/1972  Hohl et al.
4,381,894 A   5/1983  Gogol, Jr. et al.
5,254,832 A   10/1993 Gartner et al.
5,945,163 A * 8/1999  Powell et al. .......... 427/255.25

(Continued)

FOREIGN PATENT DOCUMENTS

DE    25 13 813 A1    1/1976

(Continued)

OTHER PUBLICATIONS

Soon-Gul Lee et al., Deposition angle-dependent morphology of laser deposited YBa2Cu3O7 thin films, 320 Applied Physics Letters, 65(1994) Aug. 8, No. 6, Woodbury, NY, US.

(Continued)

*Primary Examiner*—Parviz Hassanzadeh
*Assistant Examiner*—Rakesh K Dhingra
(74) *Attorney, Agent, or Firm*—Raymond R. Ferrera; Adams and Reese LLP (57) ABSTRACT

According to a first aspect, the present invention relates to a device for depositing a high temperature superconductor onto a substrate in vacuum comprising a refilling device for containing a stock of high temperature superconductor material, an evaporation device, that evaporates the high temperature superconductor material within an evaporation zone by means of an energy transferring medium, and a conveyor that transports the high temperature superconductor material continuously from the refilling device to the evaporation zone in such a way that the high temperature superconductor material delivered into the evaporation zone is evaporated essentially without residues. According to a further aspect, the present invention relates to a method to evaporate a high temperature superconductor coating onto a substrate in vacuum, comprising the steps of continuous delivery of granular high temperature superconductor material into an evaporation zone and the operation of a beam of an energy transferring medium, so that the delivered granulate is evaporated in the evaporation zone essentially without residues.

23 Claims, 7 Drawing Sheets

U.S. PATENT DOCUMENTS 6,383,301 B1 *   5/2002   Bell et al. .................... 118/716
2003/0054105 A1 *   3/2003   Hammond et al. .......... 427/294

FOREIGN PATENT DOCUMENTS

| | | | |
|---|---|---|---|
| DE | 2513813 | * | 1/1976 |
| DE | 196 80 845 | | 6/2002 |
| EP | 61003880 | | 1/1986 |
| EP | 0282839 B1 | | 9/1988 |
| EP | 01108363 | | 4/1989 |
| EP | 01108364 | | 4/1989 |
| EP | 01264114 | | 10/1989 |
| EP | 09095775 | | 4/1997 |
| EP | 11086647 | | 3/1999 |
| JP | 61-3880 | | 1/1986 |
| JP | 61-195968 | | 8/1986 |
| JP | 63244811 A | | 10/1988 |
| JP | 02-093062 | * | 4/1990 |
| JP | 9-95775 | | 4/1997 |
| JP | 11086647 A | | 3/1999 |
| JP | 2002-97566 | | 4/2002 |
| JP | 2002-294479 | | 10/2002 |
| WO | WO 98/22635 | | 5/1998 |

OTHER PUBLICATIONS

Matthew F. Davis et al., Electron beam flash evaporation for YBaCuO and BiCaSrCuO thin films, 931 Journal of Applied Physics, 66(1989) Nov. 15, No. 10, NY, US.

* cited by examiner

DEVICE AND METHOD FOR THE EVAPORATIVE DEPOSITION OF A COATING MATERIAL

1. TECHNICAL FIELD

The present invention relates to a device and a method for evaporating a coating material in vacuum ambient, particularly for the fabrication of coatings comprising complex inorganic compounds like high temperature superconductors.

2. STATE OF THE ART

Thin films of complex inorganic compounds, e.g. oxides, nitrides, carbides or alloys of various cations, serve as functional coatings or surface hardening in many applications in electronics, optics and mechanical engineering. For example films of PZT (Lead-zirconium-titanate) ceramics or $BaTiO_3$ are used for ferroelectric sensor elements or data memories with high dielectric constant. Thin epitaxial layers of $RBa_2Cu_3O_7$ (R=yttrium or a rare earth element) become superconducting at low temperatures and can be used e.g. in communication technology for highly selective radio frequency filters, or deposited on flexible metal tapes for conducting electrical current without losses.

For the economic use for many of these applications large areas or long lengths (coated conductors) have to be coated in the possibly shortest time. Since many compounds only exhibit the desired properties if the film is of high crystalline perfection, the requirements on the coating technology are very demanding. Further, for mixed compounds the correct stoichiometric composition has to be guaranteed across the entire deposition area and for the whole duration of the coating process.

As a rule, the deposition is performed by vacuum coating techniques like sputtering, Laser ablation (PLD), chemical vapor deposition (CVD), molecular beam epitaxy (MBE), or evaporation. For those techniques that start from non-conductive, ceramic compounds (targets) (e.g. sputtering, PLD) the volume deposition rate is usually very low. Techniques like CVD or co-evaporation, as described for example in EP 0 282 839 B1, employ individual material sources, where material flows have to be controlled individually by a complex control. Furthermore, since the material components do not originate from a single point source and react sensitively on local physical deposition parameters like substrate temperature or gas pressure, deviations of the film composition on a large area are inevitable.

The ideal coating technique would use a point source from which material is emerging with the correct composition at high mass flow, spreading homogenously even over long distances, and depositing on a large area. This ideal is realized in good approximation by electron beam evaporation, where a high-energy electron beam is extremely heating and evaporating the target material. For this reason, this method is used for many technical coating processes for simple compounds or elements, like e.g. aluminum for reflectors and wrapping foil, or simple oxides for optical surface coatings. However, it is problematic to evaporate mixtures of material where the individual components are strongly differing in vapor pressure, or compounds that are chemically destroyed upon electron beam irradiation (cracking) or fractionate.

JP 0 12 64 114 A describes such a method for depositing high temperature superconductor films. However, the results achieved therewith are poor. If such mixtures or compounds are evaporated from a single crucible, they fractionate and due to the continuously changing local thermal conditions the composition of the evaporating material changes with time. This problem can be faced by a rapid deflection of the electron beam into several, independent crucibles and the respective dwell times. However, this again means accepting the disadvantages of multiple, locally separated sources, i.e. gradients in the composition across larger areas.

For this reason JP 6 11 95 968 A describes an alternative method for the fabrication of alloy coatings, where the alloying components are filled in variable—sized sector—shaped pockets of a rotating evaporation source. In this way, by fast rotation under a continuous electron beam on temporal average the desired composition can be evaporated from one spot. The problem of this arrangement, however, is that the capacity of the crucibles is limited and a continuous refilling is ruled out due to the rotation. The method is therefore not appropriate for continuous long—term coating, which requires a large volume of material. The same applies for similar devices with revolving electron beam evaporator sources as described in JP 20 02 097 566 A, which enable selective evaporation of different materials, or the arrangement disclosed in JP 02 294 479 A, which prevents the electron beam from "digging in" and which guarantees an unchanging fresh surface of the evaporation material.

For continuous production the material supply plays a crucial role. For static evaporator crucibles such refilling devices are known e.g. from JP 61 003 880 A. Evaporation from a static crucible or gradual evaporation even from a crucible in motion leads to fractioning of complex compounds, like e.g. oxidic high temperature superconductors, and to problems with the chemical composition of the coating. The reason is that within the evaporator crucible no equilibrium is reached because the local thermal and chemical conditions are continuously changing.

A possible way out is the so called "flash evaporation" of individual material grains. Thereby small quantities (grains) of evaporation material are evaporated sequentially and quantitatively, i.e. essentially without residues. Thereby the vapor on temporal average over several grains is forced to exhibit the same composition as the evaporation material. Generally speaking, the almost instantaneous evaporation of a portion of material is of minor importance for quantitative evaporation compared to the establishment of an equilibrium within the evaporation zone between evaporation by the electron beam and the continuous material supply.

A first attempt for this kind of evaporation is described by Davis et al. in J. Appl. Phys. 66, (1989) 4903. The authors tried to fabricate oxide superconductor films by evaporating a thin line (trace) of powder of the respective evaporation material from front to back by an electron beam. At the hot front, individual powder grains should continuously evaporate in fractions of a second. The results of these experiments, however, were not satisfactory. Since the initial powder material exhibits a large internal surface and is partially hygroscopic, the grains absorb a lot of water. Upon strong heating the water evaporates instantaneously leading to explosions of the powder grains, which hurl them out of the evaporation zone instead of transferring them into the gas phase. For this reason a two—step process was used. In a first step, applying the electron beam at much lower power level, the powder was degassed and melted into small droplets. In the second step, it was tried to transfer these droplets into the gas phase by flash evaporation.

Davis et al. used the flash evaporation in combination with another processing step for fabricating the high temperature superconductor, by first evaporating the material in the mentioned way in high vacuum and then re-crystallizing the deposited amorphous material in an oxygen ambient, using either a heating device within the evaporation chamber at reduced oxygen pressure ("in situ"), or a furnace with oxygen at atmospheric pressure ("ex situ").

Because of the above explained processing route of Davis et al. for flash evaporation it is immediately clear that this method is not appropriate for larger quantities of material or for continuous operation. In addition, the evaporation zone is shifting continuously along the trace. Furthermore, it turned out that the droplets with a mass of around 0.1 g were already too big to be transferred into the gas phase instantaneously. Concentration depth profiles of the composition of a layer which was formed by evaporating a single droplet—in this case $YBa_2Cu_3O_7$—exhibit distinct fractioning with strong Ba—enrichment towards the film surface. For this reason, the films have to be thermally annealed and even after that exhibit poor quality.

The problem underlying the present invention is to establish a device and a method to deposit a coating material onto a substrate, that can be operated economically at high rates on the one hand, and results in high quality films on the other hand, and in this way overcomes the mentioned disadvantages of the state of the art.

3. SUMMARY OF THE INVENTION

According to a first aspect the present invention relates to a device for depositing a high temperature superconductor onto a substrate in vacuum comprising a refilling device for containing a stock of high temperature superconductor material, an evaporation device, that evaporates the high temperature superconductor material within an evaporation zone by means of an energy transferring medium beam, and a conveyor that transports the high temperature superconductor material continuously from the refilling device to the evaporation zone in such a way that the high temperature superconductor material delivered into the evaporation zone is evaporated essentially without residues.

With the device according to the invention, equilibrium is reached within the evaporation zone between the continuous evaporation of material by the energy transferring medium and the continuous material supply by the conveyor. Since the evaporation essentially without residues at a constant rate (adjustable by the material supply) occurs essentially in equilibrium and from an essentially stationary point source, a sophisticated rate control is not necessary and the composition of the deposited film is more homogenous across the entire deposition area than with already known deposition techniques. Further, in the device according to the invention the substrate can be placed very close to the evaporation zone and can cover a large angle in space to increase the evaporation material yield. This is a big advantage over arrangements with several sources (co-evaporation, MBE), which have to keep a certain minimum distance to limit deviations of the composition.

Preferably the beam of the evaporation device is scanned at least in one direction across the evaporation zone, so that the high temperature superconductor material transported by the conveyor into the evaporation zone is preferably first preheated and then evaporated.

In a first preferred embodiment the evaporation device comprises an electron beam evaporator which can be preferably modulated. However, also arrangements for generating other high energy particle beams (e.g. ion beam bombardment) or using Lasers are possible. At present, electron beams are preferred because they are comparatively cheap and can be easily modulated.

Preferably the high temperature superconductor material is delivered in form of a line into the evaporation zone, where the line width is preferably between 3 and 30 mm. The high temperature superconductor material is preferably delivered into the evaporation zone as a granulate with a grain size of 0.05-0.5 mm, preferably 0.1-0.5 mm and most preferably 0.1-0.2 mm.

Granular bulk goods are especially easy for refilling. The given parameters ensure that the heat capacity of the individual grains of the high temperature superconductor material is not too large so that they can be evaporated sufficiently fast. A similar argument holds even if the grains are not individually "flash evaporated", but are evaporated along a somehow longer stretch x, i.e. over a longer period in time. In any case, the fine granularity is important for sufficient statistics, since the material within an individual grain can thoroughly fractionate.

The conveyor comprises preferably of a revolving turntable, and/or a rotating cylinder, and/or a vibration conveyor, and /or a conveyor belt, and/or a screw conveyor or slide. These embodiments, which are only named exemplarily, allow high rotation—and conveying speed and—with a respective power adjustment of the evaporating device—result in a very high deposition rate in the continuous operation mode. The refilling device is preferably realized by a funnel.

The conveyor is preferably cooled, to avoid destruction by the electron beam. The refilling device, however, is preferably heated and contains preferably a separate pumping device. In a particularly preferred embodiment the refilling device is realized by a funnel which can be heated in its lower section and the separate pumping device is a suction pipe, which protrudes into the lower section of the funnel. The preferred granular high temperature superconductor material, especially if it is hygroscopic material, can absorb water, which leads to explosion of the grains under electron bombardment and thereby to the loss of the material from the evaporation zone. The illustrated preferred characteristics of the device prevent this and ensure further that the chamber vacuum is not affected. Alternatively, the granulate can be pre-treated and degassed thermally and can be attached to the conveyor in a sealed cartridge.

According to another preferred embodiment the high temperature superconductor material comprises of a mixture of different compounds, so that during evaporation on temporal average the desired composition of the high temperature superconductor material is deposited to avoid statistic fluctuations of the film composition. Further, thereby the average composition of the high temperature superconductor material to be evaporated can be varied flexibly, e.g. to compensate for an influence of different sticking coefficients onto the substrate on the stoichiometry. The mixing device can be placed inside or outside the vacuum, or the material is pre-mixed from different components.

Further the device contains preferably means that enable a gas supply close to the substrate, as described in DE 19 680 845 C1. Thereby it is possible to compensate for the loss of gaseous components of the evaporation material during evaporation.

According to a further aspect, the present invention relates to a method to evaporate a high temperature superconductor coating onto a substrate in vacuum, comprising the steps of continuous delivery of granular high temperature superconductor material into an evaporation zone and the operation of a beam of an energy transferring medium, so that the delivered granulate is evaporated in the evaporation zone essentially without residues.

Preferably the granulate is supplied into the evaporation zone in the shape of a line, where the beam of the energy transferring medium is guided over one end of the line, so that the line is scanned essentially across its entire width and over a small section in the direction of the conveying motion.

Further developments of the device and the method according to the invention are the subject of further depending patent claims.

4. SHORT DESCRIPTION OF THE DRAWINGS

In the following the preferred embodiments of the invention are explained in detail with reference to the following drawings, which depict:

FIG. 7c: Preferred focusing of the electron beam for the power profile of FIG. 7a;

5. DETAILED DESCRIPTION OF THE INVENTION

Figure 1:
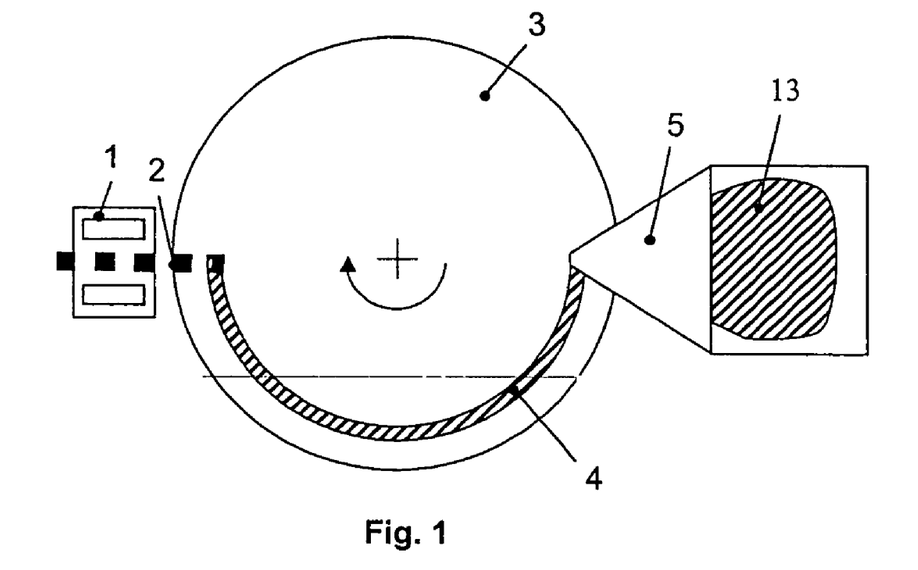
FIG. 1: Schematic sketch of a preferred embodiment of the device according to the invention viewed from top.
Figure 2:
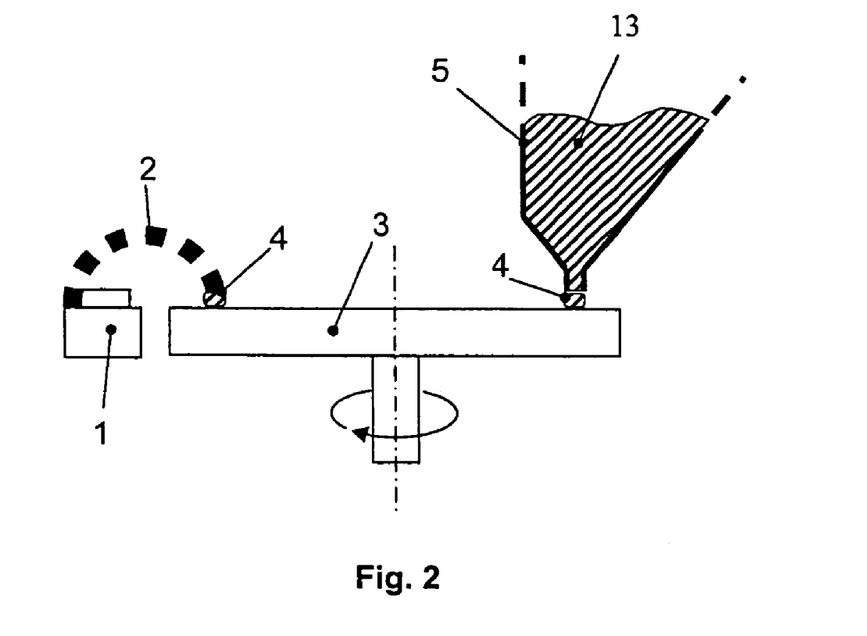
FIG. 2: Schematic cross section of a preferred embodiment of the device according to the invention with a funnel as refilling device.

In the preferred embodiment of a device according to the invention as depicted in FIG. 1, a several millimeter to several centimeter wide trace 4 of fine—granular material 13 is placed onto a conveyor realized in form of a cooled turntable 3 made of material with good heat conductivity, preferably copper, and delivered into an electron beam evaporator 1. For this purpose, the material 13 is applied in well—measured doses from a big reservoir by a continuously operating refilling device 5 onto the conveyor 3 as a line or trace 4 which is several millimeters to several centimeters wide.

The conveyor 3 extracts this trace 4 from the refilling device 5 and delivers it into the hot evaporation zone of an electron beam 2. Thereby the trace 4 is then evaporated continuously and essentially without residues. Therefore the beam 2 can be scanned across the line width or is sufficiently wide. The evaporation rate can be controlled by the rotation—or conveying speed of the conveyor 3 and the cross section of the line 4. In particular, very high evaporation rates can be realized in long term operation by respectively high conveying speed and power of the electron beam 2.

Figure 6A:
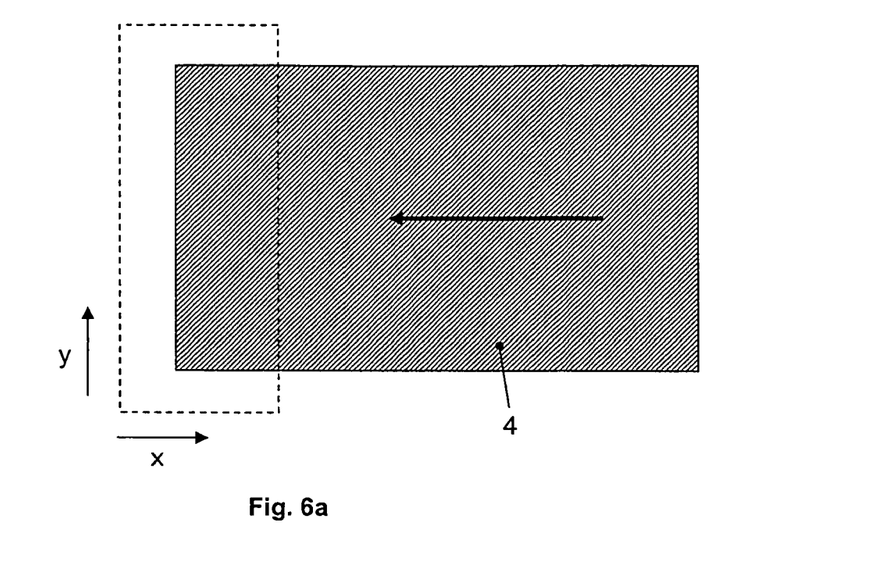
FIG. 6a: Evaporation zone of the device (broken line) at the end of the material trace. The direction of transport is marked by the arrow.

Quantitative evaporation, i.e. essentially without leaving residues, can be achieved if within a spatially very narrow evaporation zone of a few millimeter length an equilibrium is established between the continuous evaporation of material by the electron beam 2 and the material supply. Therefore, as depicted in FIG. 6a the electron beam 2 can be scanned across an area (broken line) covering the tip of the incoming material trace 4 completely, and its intensity can be modulated. Modern electron beam evaporators offer these options.

Figure 6B:
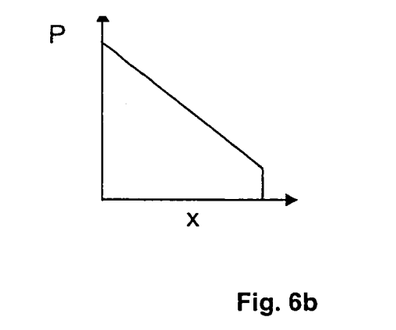
FIG. 6b: Power profile of the electron beam along the transport direction x according to a first embodiment.

According to a first embodiment the power of the electron beam 2 is modulated in such a way (cf. e.g. FIG. 6b), that the new incoming material is first pre-heated at lower power level and upon advancing into the hot evaporation zone is first melted and then essentially completely evaporated. At the other end of the evaporation zone the power P of the electron beam 2 should be such high that essentially no residues are left on top of the conveying device 3.

Figure 6C:
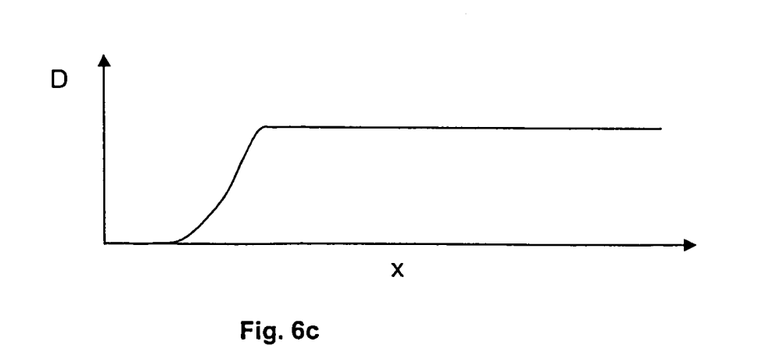
FIG. 6c: Average thickness, respectively quantity D of the material trace at the entrance into the evaporation zone.

FIG. 6c shows the spatial variation of the thickness D(x) of the material trace 4, respectively the average material quantity of the trace 4. Even if in this arrangement the various components of the evaporation material originate from different sections of the hot evaporation zone, after a short initial phase upon continuous operation an equilibrium is established, so that on average always the composition given by the evaporation material is evaporated. Since the area covered by the electron beam 2 extends only a few millimeters in the x-direction of the incoming material trace 4, the ideal concept of a point source is realized in good approximation.

To achieve high evaporation rates it has turned out as advantageous to apply the material trace 4 up to several centimeters wide (y-direction) and very thin. This avoids the formation of excessively large droplets when the material 4 melts in the entrance region of the hot evaporation zone, so that statistic variations are kept small.

With the device and the method according to the embodiments of the present invention oxide high temperature superconductor films of $YBa_2Cu_3O_7$ (YBCO), $DyBa_2Cu_3O_7$ (DyBCO), and $NdBa_2Cu_3O_7$ (NdBCO) have been fabricated. However, the device and method can also be used to fabricate the other coatings named in the introduction. In general, as high temperature superconductor preferably $RBa_2Cu_3O_7$ (R=yttrium, or an element with atomic number 57 to 71, or a mixture of these elements) is possible. Granular material with a slight copper excess and 0.1 mm grain size has been applied by a funnel 5 in shape of a 3-30 mm wide, and 0.1-1 mm thick trace 4 onto a copper turntable, and was extracted from the bottom of the funnel 5 by continuous rotation, and delivered to the electron beam 2. Oxygen was directly supplied at the about 680° C. hot substrate 7, which could be moved to prevent thickness variations, so that an epitaxial superconductor film was deposited at a deposition rate of 0.4 nm/s. However, by adjusting the rotation speed of the turntable 3 and the power of the electron beam evaporator 2 evaporation rates in excess of 2 nm/s could be realized without problems. The superconductor films fabricated on MgO single crystals exhibit transition temperatures of 87 K and critical current densities in excess of 2 $MA/cm^2$, which is rated as excellent quality for applications.

The granulate to be evaporated should preferably have a grain size between 50 μm and 500 μm. If the grains are smaller or bigger, it is possible, especially at higher evaporation rates, that they are dispersed by the electron beam 2 and are therefore not evaporated properly. These eruptions can constitute a loss of material and deviations from the stoichiometry. If this occurs actually, however, depends on the setup of the entire system.

The stoichiometry is particularly critical for high temperature superconductors. Preferably it has to be maintained within 1-2% accuracy to reproduce particularly good superconducting properties. This is a much more stringent requirement than necessary for example for fabrication of glasses or alloys. The repetition frequency for the scan of the electron beam 2 should be preferably as high as possible, but preferably at least 50 Hz, to minimize the dispersion of the evaporation material 4 by eruptions at higher evaporation rate.

To control the process a continuous measurement of the evaporation rate of the high temperature superconductor is preferred. For a long term deposition process quartz rate monitors are only poorly applicable, since they are saturated rapidly. Instead, the rate can be preferably measured by atomic absorption spectroscopy (AAS) (not shown). For that, however, at least one component of the evaporating material 4 must not be present in molecular form as an oxide, but in atomic form as an element.

It has turned out that upon electron evaporation of high temperature superconductors the Cu—component is always present in atomic form. Therefore, it is advantageous to determine the total evaporation rate of the superconductor by using the AAS of the Cu—line. At the aimed high evaporation rates and large diameters of the vapor beam for large area deposition, however, there may arise the problem, that the absorption line is saturated. This can be preferably solved by a partial shading of the vapor at the location of the measurement, so that the absorption preferably occurs only in a multitude of well-defined sections of the light beam. The positions of the sections can be preferably chosen in such a way that the respective Doppler shifts of the Cu—absorption line all together cover the whole spectral width of the light beam. The lengths of the sections are preferably chosen in such a way that the absorption at the desired evaporation rate is approximately 30%.

Preferably, in combination with the actual high temperature superconductor layer also further auxiliary layers of different oxide materials are deposited as a base or cap layer. They serve as diffusion barriers, for establishing texture, as seed layer, or as protection against environmental influence etc. For technical and economic reasons it is preferred to deposit them onto the substrate 7 sequentially with the actual superconductor layer in situ, i.e. without breaking the vacuum. For this reason it is advantageous if it is possible to evaporate different materials sequentially with the same device, e.g. by placing several storage containers 5, which can each be closed at their bottom outlet, next to each other on top of the conveyor 3.

For evaporation of a certain material one of the storage containers 5 is opened and the scanning area of the electron beam 2 is adjusted to the respective material trace 4. The closure at the outlet of the storage container 5 can be e.g. realized by a plug (not shown), located inside the storage container 5. For fine-grain material the plug just has to block the outlet and does not have to seal it tightly. Hence, it can be lifted (outlet open) or lowered (outlet closed) by a simple mechanism. For lowering, the residual material underneath the plug has to be preferably removed from the outlet by operating of the conveyor 3, before the evaporation of the new material is started. If space is restricted, it may be advantageous not to place the various storage containers permanently on top of the conveyor 3, but to use a mechanism to position only a partial number of storage containers, preferably only a single storage container 5 on top of the conveyor 3. The mechanism can be for example, a revolver, a magazine, or a single lowering device (not shown) for each container.

For further description of variations of the device and the method according to the invention, the currently particularly preferred examples 1-10 are explained in more detail in the following:

EXAMPLE 1

Granular evaporation material 13 is conducted by a trapezoid funnel 5 onto a rotating, water—cooled copper turntable 3 of an electron beam evaporator 1. Due to the rotation of the turntable 3 a fine trace of material 4 is extracted at the bottom of the funnel 5 and delivered to the electron beam 2 on the opposite side. The power and focus of the electron beam 2 is adjusted in such a way, that upon entering the hot evaporation zone the arriving grains of the evaporation material evaporate rapidly and essentially without residues, i.e. they evaporate quantitatively. The vapor spreads unimpeded within the high vacuum chamber 6 and condenses onto a substrate 7 which can be heated if necessary (cf. Substrate heater 8 in FIG. 3). If required, a reactive gas can also be introduced into the chamber 6 or supplied directly at the substrate 7 by an appropriate device 9, 10.

In contrast to the mentioned state of the art of Davis et al. the flash evaporation is used as a one-step technique for fabricating high temperature superconductors.

Figure 3:
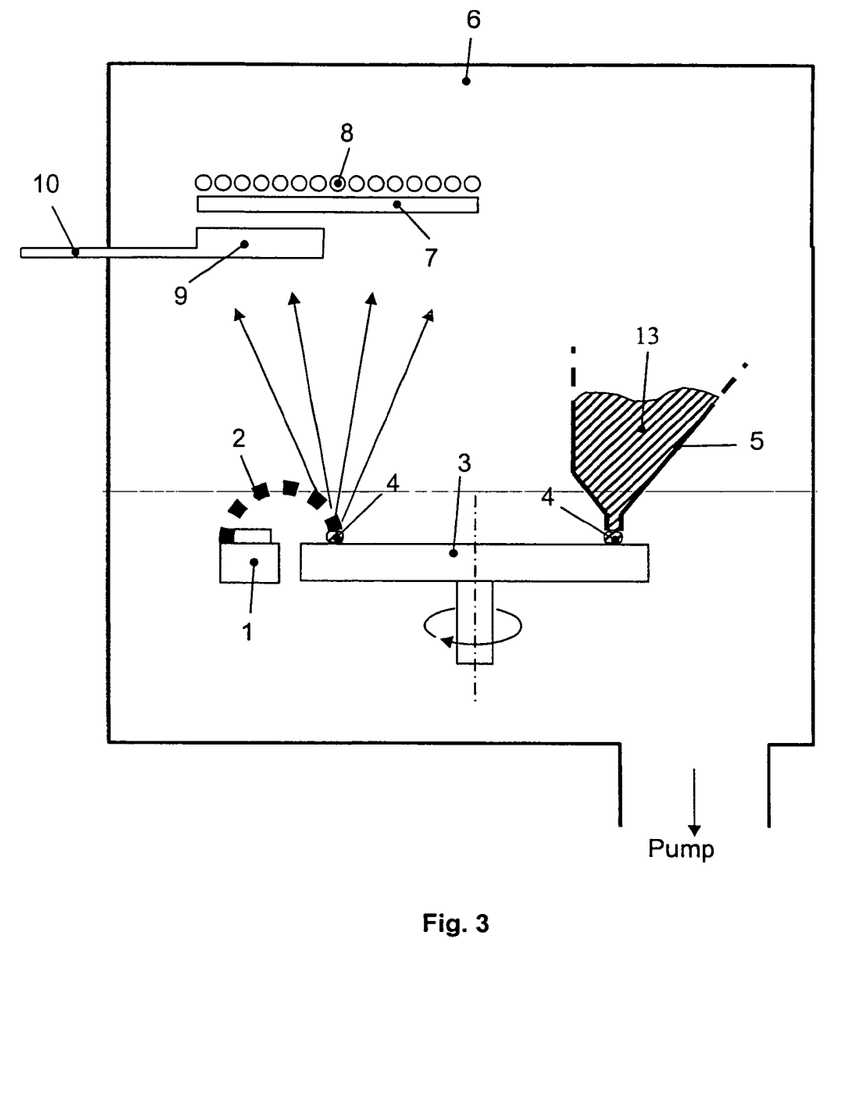
FIG. 3: Schematic cross section of a preferred embodiment of the device according to the invention with electron beam evaporator, material refilling, and substrate holder.

Therefore, the oxygen necessary for oxidation and crystal formation is supplied directly during the material deposition, using the device 9, 10 according to FIG. 3 and by increasing the substrate temperature by a heater 8.

Figure 4:
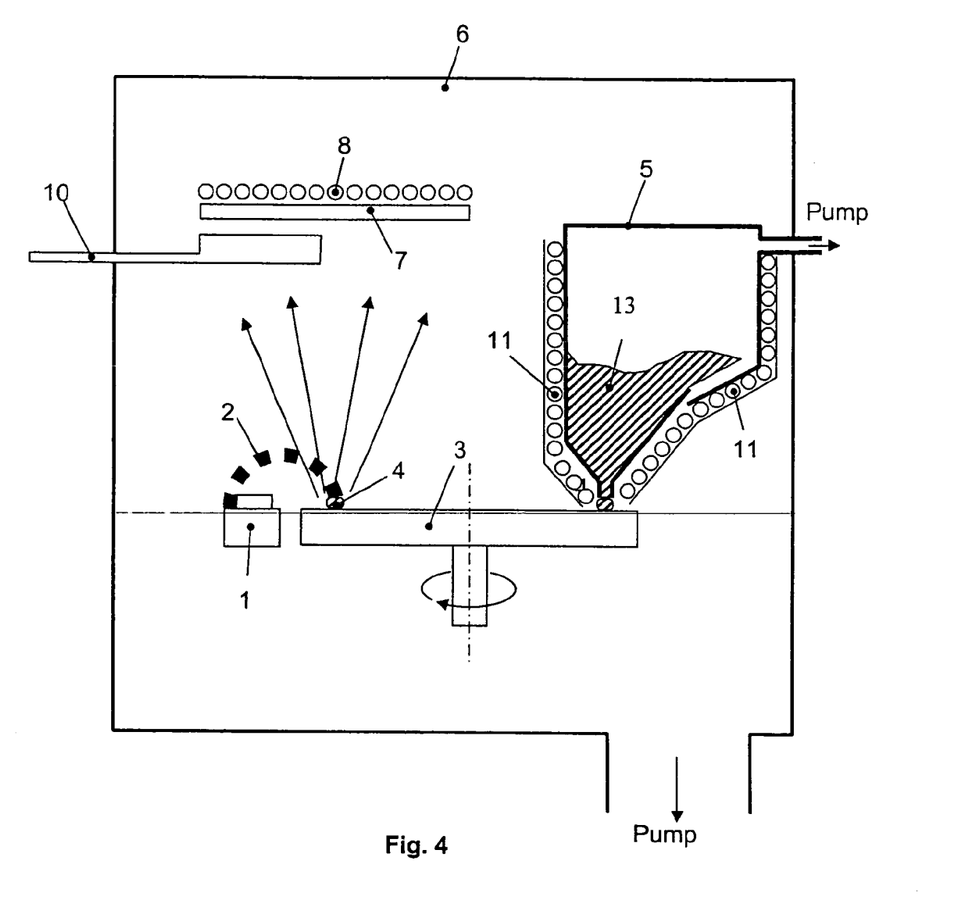
FIG. 4: Schematic cross section of a preferred embodiment of the device according to the invention with electron beam evaporator, substrate holder, and material storage container which can be heated and pumped.

Additionally, the flash evaporation of high temperature superconductors can be used in combination with a moving substrate 7, for example by rotating the substrate 7 in FIGS. 3 and 4 around a vertical axis (not shown). This has the advantage of a more homogeneous stoichiometry on a large area, which is particularly critical for high temperature superconductors. Beyond that, the motion of the substrate is advantageous for depositing on a large number of substrates (e.g. wafer deposition in a series production), or very large substrates (e.g. substrate plates for fault current limiters), or very long tape ("coated conductors"), which are continuously transported through the evaporation zone without interrupting the evaporation process.

EXAMPLE 2

The setup corresponds to that described in example 1. The granulate 13, however, originates from a closed storage container 5 which can be heated by heater elements 11 and which can be pumped at through a pumping neck to remove released residual gas. With such a setup evaporation rates of 5 nm/s have been achieved. For this, a preferred grain size of 100-200 µm has been used and the preferred scanning repetition frequency was 90 Hz. The stoichiometry deviation on an area of 20 cm×20 cm was merely 1%.

EXAMPLE 3

Figure 5:
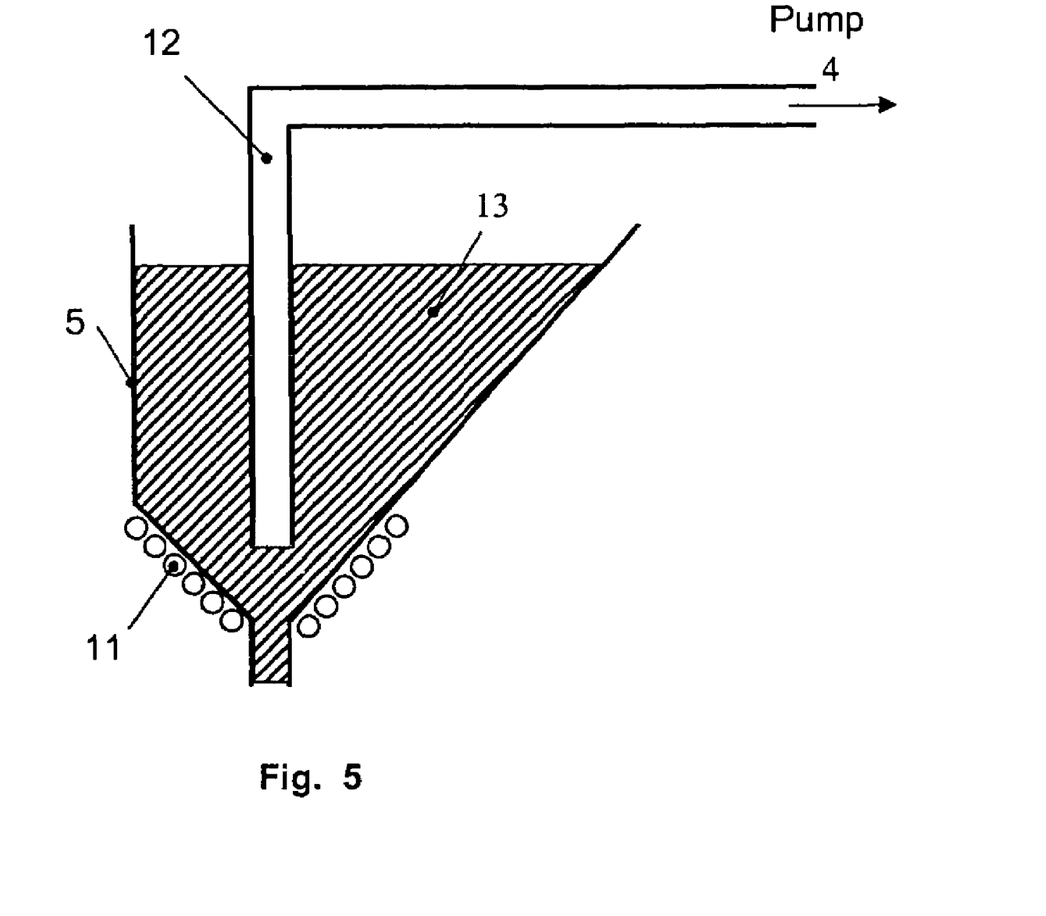
FIG. 5: Detailed drawing of a heatable refilling funnel with suction pipe.

The setup corresponds to that described in example 1. The granulate 13, however, is supplied through a funnel 5, which is heated only in its bottom outlet section by heater elements 11. The thereby released water vapor is pumped away directly at its origin by a suction pipe 12, preferably with a sieve in front of the inlet (not shown).

EXAMPLE 4

Granular evaporation material 13 is conducted by a conveyor belt, a screw conveyor or a similar conveyor like a slide (not shown) onto a rotating, water—cooled copper turntable 3 of an electron beam evaporator. Due to the rotation of the turntable 3 a fine trace of material 4 is delivered to the electron beam 2 on the opposite side. The power and focus of the electron beam 2 is adjusted in such a way, that upon entering the hot evaporation zone the arriving grains of the evaporation material 13 evaporate rapidly and essentially without residues, i.e. they evaporate quantitatively. The vapor spreads unimpeded within the vacuum chamber 6 and condenses onto a substrate 7 which can be heated by a substrate heater 8 if necessary. If required, a reactive gas can also be introduced into the chamber or supplied directly at the substrate 7 by an appropriate device 9, 10.

EXAMPLE 5

Granular evaporation material 13 is applied by a refilling device, e.g. a trapezoid funnel 5, onto a rotating, water—cooled drum (not shown) and delivered as a fine line to the electron beam 2 of an electron beam evaporator. The power and focus of the electron beam 2 is adjusted in such a way, that upon entering the hot evaporation zone the arriving grains of the evaporation material evaporate rapidly and essentially without residues, i.e. they evaporate quantitatively. The vapor spreads unimpeded within the high vacuum chamber 6 and condenses onto a substrate 7 which can be heated by a substrate heater 8 if necessary. If required, a reactive gas can also be introduced into the chamber or supplied directly at the substrate 7 by an appropriate device 9, 10.

EXAMPLE 6

Granular evaporation material 13 is applied by a refilling device, e.g. a trapezoid funnel 5, onto a water—cooled vibration conveyer and delivered as a fine line to the electron beam 2 of an electron beam evaporator 1. The power and focus of the electron beam 2 is adjusted in such a way, that upon entering the hot evaporation zone the arriving grains of the evaporation material evaporate rapidly and essentially without residues, i.e. they evaporate quantitatively. The vapor spreads unimpeded within the high vacuum chamber 6 and condenses onto a substrate 7 which can be heated by a substrate heater 8 if necessary. If required, a reactive gas can also be introduced into the chamber 6 or supplied directly at the substrate 7 by an appropriate device 9, 10.

EXAMPLE 7

Granular evaporation material 13 is applied by a refilling device, e.g. a trapezoid funnel 5, onto a cooled conveyer belt and delivered as a fine line to the electron beam 2 of an electron beam evaporator. The power and focus of the electron beam is adjusted in such a way, that upon entering the hot evaporation zone the arriving grains of the evaporation material evaporate rapidly and essentially without residues, i.e. they evaporate quantitatively. The vapor spreads unimpeded within the high vacuum chamber 6 and condenses onto a substrate 7 which can be heated by a substrate heater 8 if necessary. If required, a reactive gas can also be introduced into the chamber 6 or supplied directly at the substrate 7 by an appropriate device 9, 10.

EXAMPLE 8

Material feeding and transport correspond to one of the previous examples 1-7. The material trace 4 can have a width of several centimeter. The electron beam 2 is scanned over an area, which covers the width of the arriving material trace 4 completely, e.g. a rectangular area as shown in FIG. 6*a*. Thereby the power P of the electron beam 2 is modulated in such a way, that with proceeding position the arriving material is first pre-heated, melted, and then completely evaporated. An appropriate power profile is shown for example in FIG. 6*b*. The shape of the profile (e.g. linear, exponential, sinusoidal, etc.) can be chosen appropriately. In this context it is mainly important that the peak power is set sufficiently high, so that all the material evaporates essentially without residues. In this case, for example a thickness profile as shown in FIG. 6*c* may be established.

EXAMPLE 9

Figure 7A:
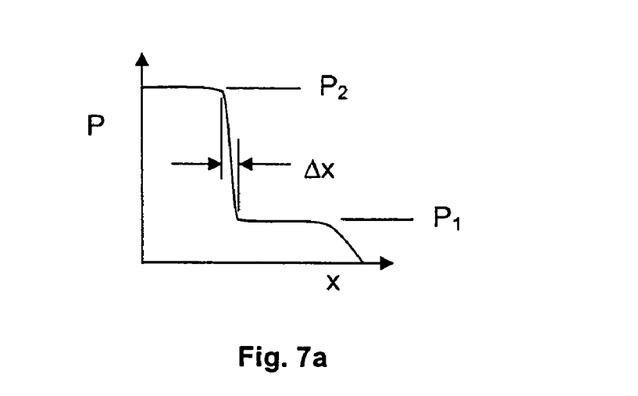
FIG. 7a: Power profile of the electron beam in the transport direction according to another preferred embodiment.

According to a further embodiment a preferable 2—stage profile is used with essentially two power levels for the electron beam 2 as shown in FIG. 7*a*. Thereby the power level $P_1$ is preferably chosen in such a way that the material is annealed but the temperature is not sufficient to evaporate components of the high temperature superconductor, particularly Cu. The power level $P_2$ is preferably chosen such that, the high temperature superconductor is evaporated quantitatively. The transition width $\Delta x$ between the two zones is preferably as narrow as possible, so that the material evaporates instantaneously quantitatively. Then, a linear slope of the thickness profile D(x) according to FIG. 7*b* is established.

If the transition width $\Delta x$ between the two power zones is not sufficiently narrow, there is a danger, that the upper edge of the slope (i.e. the boundary between the two power zones) is rounded and particularly the copper component of the granulate evaporates with a false directional pattern. To achieve a narrow transition the electron beam has to be preferably focused in such a way, that while scanning it reaches the smallest possible width, when it is located at the upper edge of the slope. This is depicted schematically in FIG. 7*c*.

Figure 7B:
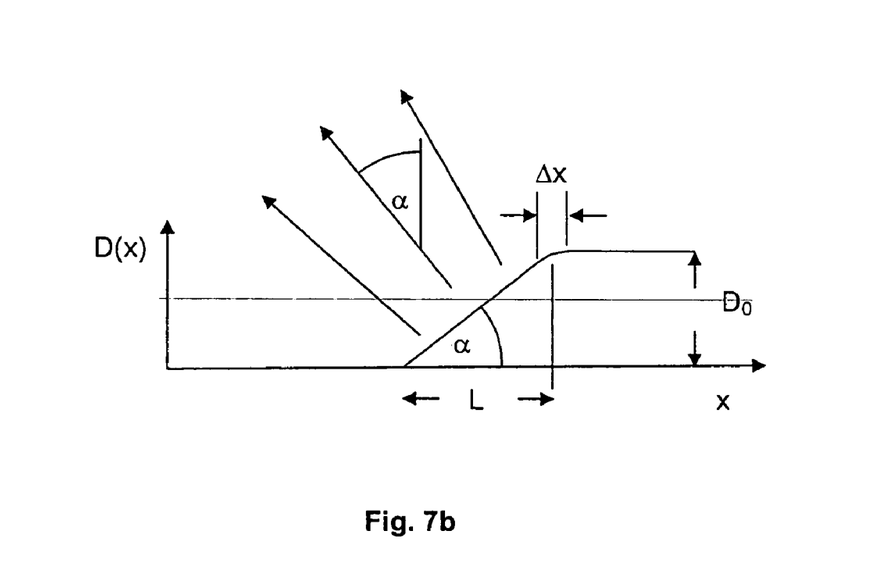
FIG. 7b: Thickness profile D(x) of the evaporation material in the evaporation zone if the power profile of FIG. 7a is employed.
Figure 7C:
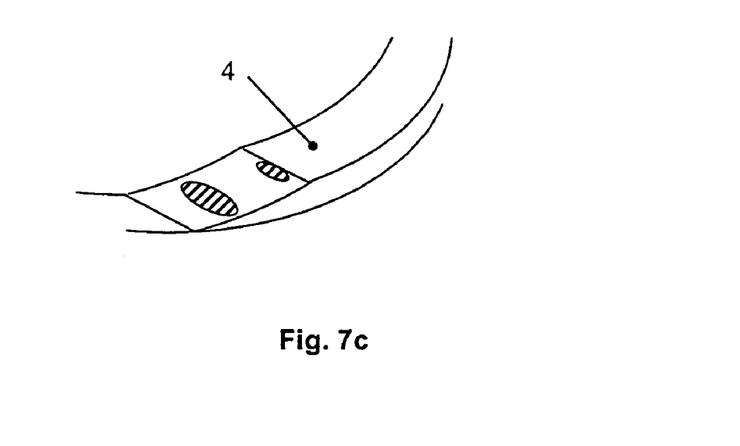

The inclination angle $\alpha$ of the slope in FIG. 7*b* is determined by the conveying velocity of the evaporation material $v_F$ and the evaporation speed of the material trace dD/dt according to $\tan \alpha = (dD/dt)/v_F$. Thereby the angle $\alpha$ can be adjusted for every evaporation speed by the conveying velocity.

Since the evaporation material evaporates preferably from the slope, the directional pattern of the evaporating material is inclined by the angle $\alpha$ against the normal of the conveying device (cf. FIG. 7*b*). In most cases the inclination is disadvantageous for the deposition. Therefore, $\alpha$ should preferably not be bigger than 20°. On the other hand, if the angle $\alpha$ becomes too flat, at a given initial thickness $D_0$ of the material trace the length L of the evaporation zone increases according to $L = D_0 / \tan \alpha$. Preferably, L should not be longer than 10 mm, that the material evaporates sufficiently point—like and no noticeable gradients in the stoichiometry result on the substrate. Hence, at a typical thickness $D_0 = 1$ mm preferably $\alpha$ should not be smaller than 6°.

Figure 8A:
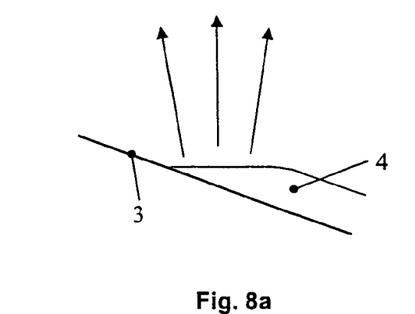
FIG. 8a,b: Schematic drawing of the inclination of the conveyor (FIG. 8a) and the substrate (FIG. 8b) for compensation of the inclined directional pattern of the evaporating material.
Figure 8B:
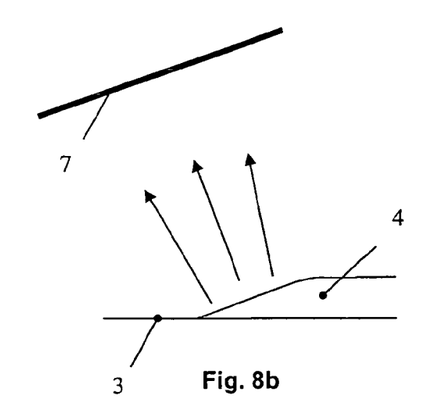

The inclination of the directional pattern of the evaporating material at the angle $\alpha$ can be compensated by inclining the entire conveyor 3 including the conveyor trace 4 by essentially the same angle in the opposite direction. This is shown schematically in FIG. 8a. However, if the inclination angle is too big, the transport of the evaporation material can be impeded when the trace 4 on top of the conveying device 3 begins slipping. This problem is avoided by another option to compensate the angle α by inclining the substrate 7 corresponding. This is shown schematically in FIG. 8b.

EXAMPLE 10

Figure 9:
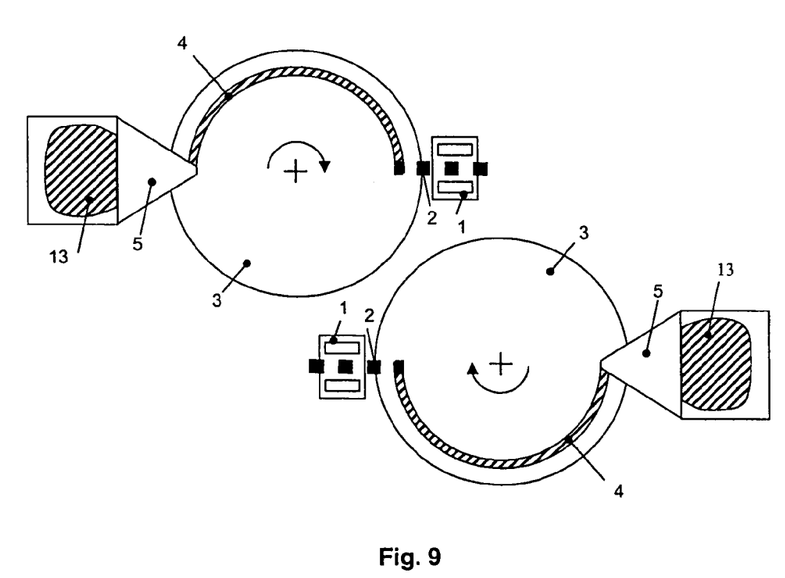
FIG. 9: Combination of two evaporation devices for a symmetric directional pattern of the evaporating material.

To arrive at a symmetric directional pattern of the evaporating material despite the inclination at an angle α, according to another embodiment two or more evaporation devices can be employed, too. E.g. two evaporation devices can be preferably placed next to each other, so that the evaporation zones are facing each other. This is shown in FIG. 9. The evaporation rates of both devices should preferably coincide in this case.

LEGEND OF REFERENCE NUMBERS

1 Electron gun
2 Electron beam
3 Turntable (rotating)
4 Material trace (line)
5 Refilling device (funnel, storage container)
6 Vacuum chamber
7 Substrate
8 Substrate heater
9 Reactive gas supply
10 Gas inlet
11 Heating element
12 Suction pipe
13 Granulate

The invention claimed is:

1. Device for continuous evaporation of a high temperature superconductor onto a substrate in a vacuum comprising:
   a. a refilling device with a stock of high temperature superconductor material;
   b. an evaporation device which evaporates the high temperature superconductor material in an evaporation zone by a beam of an energy transferring medium;
   c. a conveyor which transports the high temperature superconductor material from the refilling device to the evaporation zone; wherein
   d. the evaporation device is adapted to pre-heat the high-temperature superconductor material in a first part of the evaporation zone by a first energy of the beam of energy transferring medium and to evaporate the pre-heated high-temperature superconductor material in a second part of the evaporation zone by a second energy of the beam of energy transferring medium, wherein said second energy is greater than said first energy.

2. Device according to claim 1, further comprising a means to scan the beam of the evaporator in at least one direction over the evaporation zone.

3. Device according to claim 2, wherein the means scans the beam at a repetition frequency of greater than about 50 Hz and preferably at about 90 Hz.

4. Device according to claim 1, further comprising a means to first preheat and then evaporate the high temperature superconductor material delivered to the evaporation zone by the conveyor.

5. Device according to claim 4, where the evaporation device comprises at least two power levels for the beam, with a narrow transition width between the first and the second power level to achieve a linear gradient of a thickness profile of a delivered high temperature superconductor material.

6. Device according to claim 5, wherein the conveying speed of the conveyor can be adjusted to satisfy at least one of the conditions that an angle of a slope α is less than about 20°, and the length of the evaporation zone is less than about 10 mm.

7. Device according to one of the claims 5 or 6, wherein the beam of the energy transferring medium can be focused in such a way that while scanning it reaches a minimum width when it is focused approximately at the upper edge of the slope.

8. Device according to claim 1, wherein the conveyor and the substrate can be tilted to compensate for an inclined directional pattern of the material evaporating from the conveyer.

9. Device according to claim 1, wherein the evaporation device comprises an electron beam evaporator which can be modulated.

10. Device according to claim 1, wherein the high temperature superconductor material is conveyed into the evaporation zone in the shape of a line with a width of greater than about 3 mm and less than about 30 mm.

11. Device according to claim 1, wherein the conveyor transports the high temperature superconductor material to the evaporation zone as a granulate with a grain size of greater than about 0.1 mm and less than about 0.2 mm.

12. Device according to claim 1, wherein the conveyor can be cooled and comprises at least one of a rotating turntable, rotating drum, a vibration conveyor, a conveyor belt, a screw conveyor, and a slide.

13. Device according to claim 1, wherein the refilling device is designed as a funnel and can be heated.

14. Device according to claims 1, wherein the refilling device has a separate pumping device.

15. Device according to claim 14, wherein the refilling device is designed as a funnel which can be heated in a bottom section, and the separate pumping device is designed as a suction pipe which protrudes into the bottom section of the funnel.

16. Device according to claim 1, wherein the high temperature superconductor material is a mixture of different compounds, so that upon evaporation on temporal average the desired composition of the high temperature superconductor material is deposited.

17. Device according to claim 1, further comprising a means to supply a gas close to the substrate.

18. Device according to claim 1, further comprising a means to heat and move the substrate relative to the evaporation zone.

19. Device according to claim 1, further comprising a means to measure an evaporation rate by atomic absorption spectroscopy.

20. Device according to claim 19, further comprising a means to partially shade the vapor of the high temperature superconductor material where a measuring light beam is located to avoid saturation of the absorption line.

21. Device according to claim 1, further comprising a second refilling device having source material for an auxiliary layer of the high temperature superconductor film.

22. Device according to claim 21, further comprising a means for connecting said second refilling device to the first refilling device, and for holding a stock of high temperature superconductor material sequentially with the conveyor.

23. Method for continuously evaporating a high temperature superconductor coating onto a substrate in a vacuum comprising the steps of:
- a. continuously conveying a granulate of a high temperature superconductor material into a evaporation zone;
- b. pre-heating the high-temperature superconductor material in a first part of the evaporation zone by a first energy of the beam of energy transferring medium; and
- c. evaporating the pre-heated high-temperature superconductor material in a second part of the evaporation zone by a second energy of the beam of energy transferring medium so that the delivered granulate is evaporated essentially without residues within the evaporation zone.

* * * * *